United States Patent [19]

Marker, III et al.

[11] Patent Number: 5,323,108
[45] Date of Patent: Jun. 21, 1994

[54] METHOD FOR GENERATING FUNCTIONAL TESTS FOR PRINTED CIRCUIT BOARDS BASED ON PATTERN MATCHING OF MODELS

[75] Inventors: Robert E. Marker, III; Darrell B. Johnsrud, both of Loveland, Colo.

[73] Assignee: Hewlett-Packard Company, Palo Alto, Calif.

[21] Appl. No.: 824,617

[22] Filed: Jan. 23, 1992

[51] Int. Cl.$^5$ ............................ G01R 1/00; G01R 1/02
[52] U.S. Cl. ................................ 324/158 R; 324/73.1; 371/27
[58] Field of Search ................... 324/158 R, 73.1, 537; 371/15.1, 16.1, 22.1, 22.6, 27, 26

[56] References Cited

U.S. PATENT DOCUMENTS

| | | | |
|---|---|---|---|
| 4,380,070 | 4/1983 | Steiner | 324/73.1 |
| 4,484,329 | 11/1984 | Slamka et al. | 371/26 |
| 4,500,993 | 2/1985 | Jacobson | 371/27 |
| 4,622,647 | 11/1986 | Sagnard et al. | 371/27 |
| 4,829,520 | 5/1989 | Toth | 371/22.1 |
| 5,004,978 | 4/1991 | Morris, Jr. et al. | 371/27 |
| 5,032,789 | 7/1991 | Firooz et al. | 324/73.1 |
| 5,101,151 | 3/1992 | Beaufils et al. | 371/22.6 |

Primary Examiner—Vinh Nguyen

[57] ABSTRACT

A method for generating a functional test for a loaded printed circuit board automatically generates a test for a cluster of elements which may be tested together as a functional unit by pattern matching with pre-defined cluster models contained in a library. The method includes the following steps. First, an electrical description of the printed circuit board is analyzed to identify any clusters of elements which match any pre-defined cluster models. When a match is found, a generic test routine is retrieved from the model and used to generate a functional test for the cluster of elements on the printed circuit board. Thereafter, tests are generated for remaining, non-clustered devices by matching each device to a generic model within a device models library, and then retrieving a generic test routine therefrom.

2 Claims, 10 Drawing Sheets

| COL 1 | COL 2 | COL 3 | COL 4 | COL 5 | COL 6 |
|---|---|---|---|---|---|
| EUA (TYPE.PIN) | CIRCUIT 700 | | CLUSTER MODEL 710 (TYPE.PIN) | CLUSTER MODEL 720 (TYPE.PIN) | CLUSTER MODEL 740 (TYPE.PIN) |
| | NODE | DEVICE (TYPE.PIN) | | | |
| B.1 | 702 | A.0 | X | X | X |
| B.0 | 703 | C.1 | D.1 | C.1 | C.1 |

3049

"X" = DON'T CARE

| EUA (TYPE.PIN) | CIRCUIT 700 | | (TYPE.PIN) | (TYPE.PIN) |
| --- | --- | --- | --- | --- |
| | NODE | DEVICE (TYPE.PIN) | | |
| B.I | 702 | A.O | X | X |
| B.O | 703 | C.I | C.I | C.I |
| C.O | 704 | D.I | X | H.I |

"X" = DON'T CARE

FIG 8B

METHOD FOR GENERATING FUNCTIONAL TESTS FOR PRINTED CIRCUIT BOARDS BASED ON PATTERN MATCHING OF MODELS

FIELD OF THE INVENTION

The present invention relates to the field of functional testing of loaded printed circuit boards. More specifically, the invention relates to a method for expediting generation of in-circuit test by automatically identifying devices within an electronic circuit which may be tested together as a cluster of devices and then retrieving, for each cluster, a pre-defined test pattern from a library.

BACKGROUND ART

Traditionally, automated testing of loaded printed circuit boards (PCB's) involved functional test wherein input signals were provided to the external inputs of a PCB and output signals were observed from the external outputs of the PCB. This type of functional testing, however, can become very complicated for complex circuitry and can provide only limited diagnostics. Modern testing increasingly supplements this traditional functional test with the efficient, flexible in-circuit test. In-circuit test is a type of functional test wherein the performance of each device (e.g., a digital integrated circuit) on a PCB is independently tested as a functional unit.

In-circuit testing is described in detail in U.S. Pat. No. 5,004,978, entitled "METHOD FOR REGENERATING IN-CIRCUIT TEST SEQUENCES FOR CIRCUIT BOARD COMPONENTS", which is incorporated herein by reference.

In order to perform in-circuit test, a tester must apply input signals directly to the inputs of a DUT (device under test) and must access the outputs of the DUT to observe the output response. A "bed-of-nails" (i.e., probes that directly make contact with the device I/O pins from pads on the surface of the PCB) fixture is used to provide access to the required nodes on the PCB. Each device can then be tested as if it were electrically isolated from the circuit.

A principal advantage of in-circuit testing is that tests for many common IC's (integrated circuits) can be programmed once, in advance, and then stored in a library. The tests can then be called upon when needed. This greatly simplifies test generation since this pre-programmed test can be used over and over again.

Figure 1:
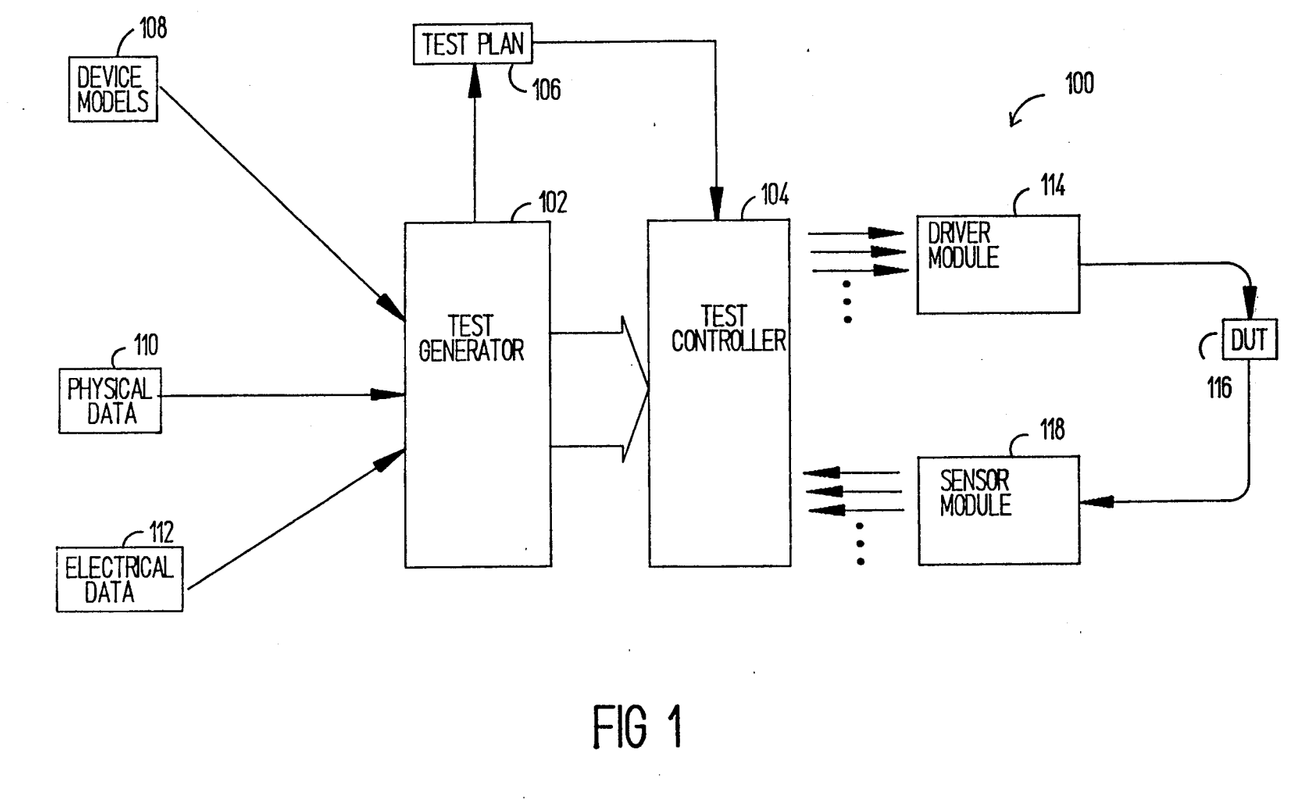
FIG. 1 is a block diagram of a conventional ATE system.

In-circuit testing is conventionally performed on an ATE (Automated Test Equipment) system. An ATE system (tester) 100 is shown in FIG. 1. ATE system 100 includes a test generator 102 and a test controller 104. Test generator 102 generates an in-circuit test for each device on the PCB under test. A generic test plan 106 provides supervisory control over testing. This includes sequencing the tests, logging the results, controlling PCB/fixture interfacing, controlling the test power supplies, and providing a user interface.

The combination of the individual in-circuit tests and test plan 106 forms a PCB test specification. A device models library 108, physical database 110, and an electrical database 112 provide the data required for test generator 102 to generate the individual in-circuit tests. Electrical database 112 contains a list of the electrical devices on the PCB, an electrical description for each device, electrical interconnect information, a list of the devices to be tested, and test requirements for each device (e.g., required power supply voltages and test probe requirements). For the HP3070 tester (described below), the electrical data is stored in the "BOARD" file. Physical database 110 contains a topological description of the PCB which will be used by test controller 104 to locate and test each DUT 116. Physical database 110 also contains user-defined information, such as node accessibility.

Physical database 110 and electrical database 112 are typically generated by a CAD/CAM (Computer Aided Design/Computer Aided Manufacturing) system during design of a PCB.

Device models library 108 contains a plurality of pre-generated generic models for commonly used digital integrated circuit chips (IC's). Essentially, each model is a test routine which may be inserted (i.e., edited) into the PCB test specification. Each device model provides, for a specific device: pin-out information (i.e., which pins are inputs, outputs, bi-directional, or unused), trace data (i.e., information which relates each device output to the device inputs which affect it), a test routine, a method for pre-conditioning each output of the device, and device specific information including a test pattern rate and required signal levels. When devices which are not represented in device models library 108 are encountered, a model may be manually entered into the tester and, if desired, the models library.

Test controller 104 executes the in-circuit tests generated by test generator 102. A driver module 114 is used to apply the test signals to a DUT 116, and a sensor (receiver) module 118 is used to receive the response of DUT 116 to the test signals. The combination of driver module 114 and sensor module 118 is known as a tester channel.

The HP3070 programmable in-circuit tester is an example of an ATE system. The HP3070 tester is manufactured by Hewlett-Packard Company, Palo Alto, Calif. Detailed operational information for the HP3070 is contained in "HP3070 Board Test System User's Documentation Set (1989)" available from Hewlett-Packard under HP part number 44930A.

While in-circuit test provides a thorough test mechanism, the test can become lengthy since each component is tested independently. In addition, certain devices may not be independently testable due to node accessibility problems, special signal requirements, or device complexity. The node accessibility problem is exacerbated by increasing circuit miniaturization and complexity (e.g., surface mount devices, multi-chip modules, ASIC's, etcetera).

Figure 2:
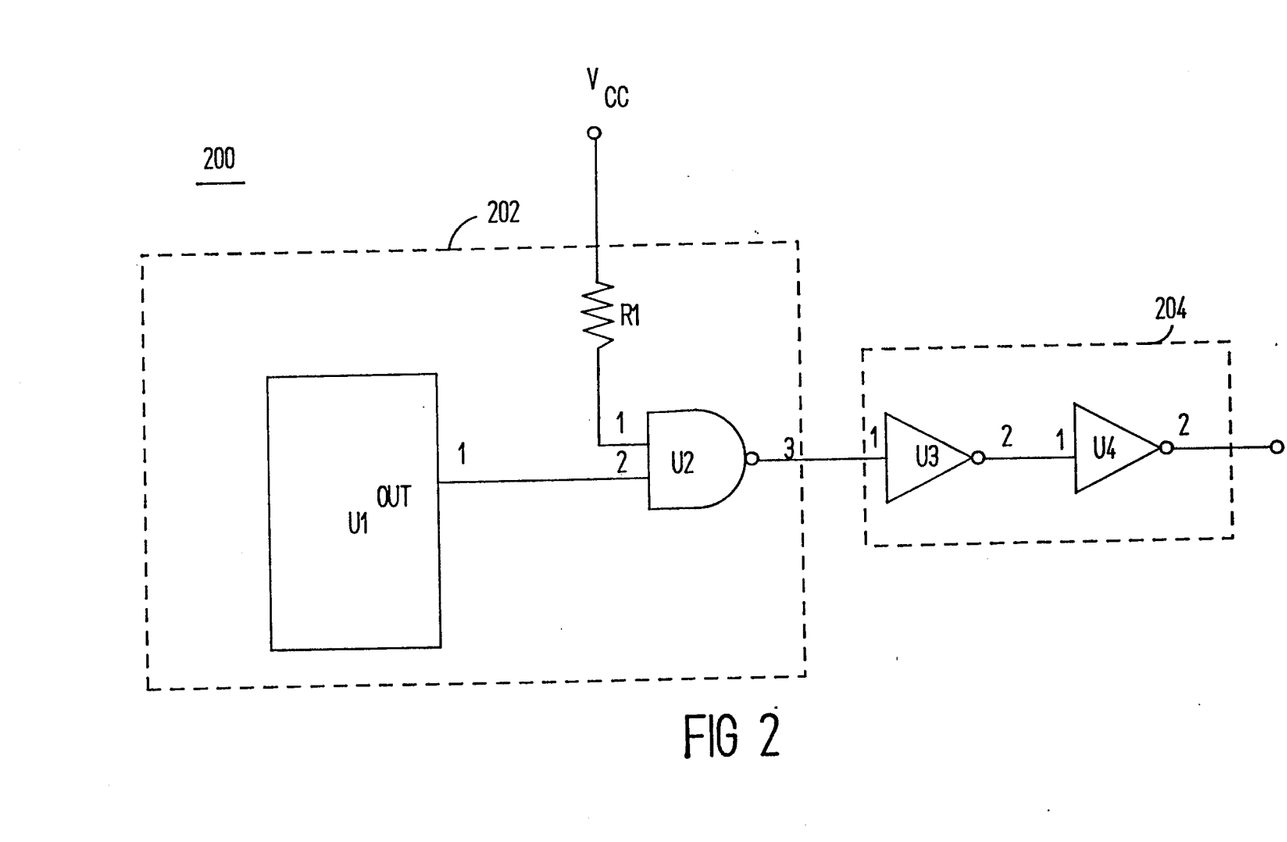
FIG. 2 is a schematic diagram of a sample circuit used to illustrate the problems being solved by the invention.

A sample circuit 200 illustrating these problems is shown in FIG. 2. Circuit 200 includes an oscillator U1, a NAND gate U2, an inverter U3, and a buffer U4. The output (pin U1-1) of oscillator U1 is tied to an input (pin U2-2) of NAND U2. The other input (pin U2-1) of NAND U2 is connected to the logic supply voltage $V_{CC}$ through a resistor R1. The output (pin U2-3) of NAND U2 is connected to the input of inverter U3 (pin U3-1). The output of inverter U3 (pin U3-2) is connected to the input of buffer U4 (pin U4-1).

In attempting to test circuit 200, any number of problems can occur. For example, the oscillator signal from oscillator U1 may interfere with testing of downstream devices U2-U4. The conventional in-circuit method would test U2 by driving pins U2-1 and U2-2 and then inspecting pin U2-3 for the proper response. Driving pin U2-2, however, requires backdriving the output (pin U1-1) of U1. U1-1 is an oscillator output which cannot be reliably backdriven. Therefore, U2 cannot be tested. Further, the oscillator signal from U1 will be propagated downstream through U2 to U3 and U4 (and beyond), interfering with testing of these downstream devices. Thus, it is desirable to disable U1. U1, however, does not have a disable feature.

A common solution to this problem is to "group" or "cluster" U1 and U2 together and to test the pair as a functional unit or cluster 202. Cluster 202 functionally represents an oscillator with a disable feature. That is, if pin U2-1, is pulled LOW by a probe of the tester, then pin U2-3 will always be HIGH (due to the logical NAND function of U2). This prevents the oscillator signal from U1 from propagating through U2 so that it appears that U1 has been disabled with respect to U3 and U4. This benefits the testing of all downstream components. Further, both U1 and U2 and the interconnection between them may be tested at the same time.

Another problem which can occur during testing of circuit 200 is that of inaccessible pins. For example, pins U3-2 and U4-1 may be unavailable at the surface of the PCB so that both U3 and U4 cannot be tested. Clustering there two devices together into a cluster 204, however, will allow testing of both devices together as a single functional block. This obviates the need to access pins U3-2 and U4-1.

In addition to solving test access problems, clustering can be used to simplify and speed the in-circuit test by dividing a complex circuit into a relatively small number of testable clusters. Each cluster can then be tested to provide a pass/fail indicator of device performance. This actually results in a better indication of device function than in-circuit test on a device by device basis because the interrelation between the components is also tested. Further, the in-circuit test is shortened because many components are tested together rather than separately.

Figure 3:
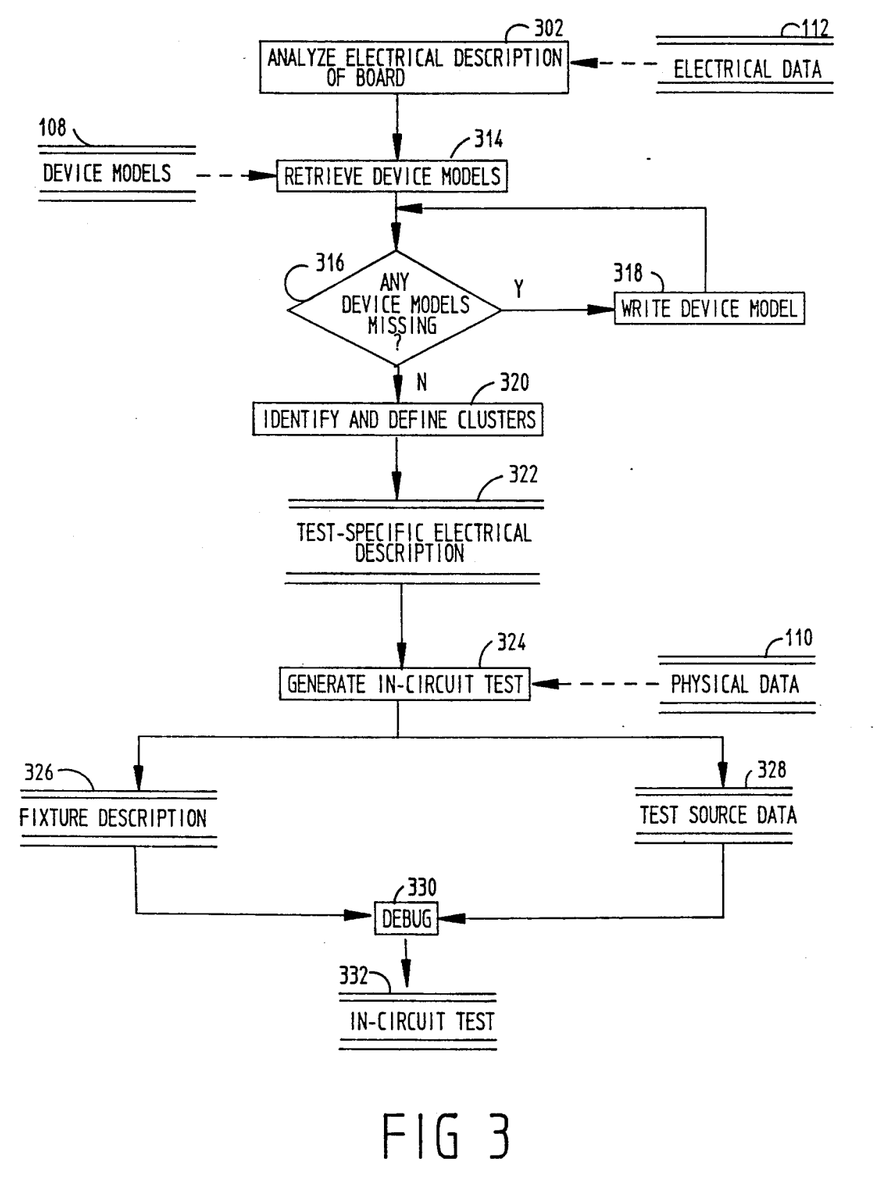
FIG. 3 is a flow chart illustrating the conventional method of generating an in-circuit test for a loaded PCB.

Conventionally, in-circuit tests have been used to test as many components as possible with cluster testing being performed only if a device was not testable due to one of the above-described problems. The conventional method for generating an in-circuit test is shown in FIG. 3. At step 302, an electrical description of the PCB from electrical database 112 is analyzed to determine which devices require testing. At step 314, a generic device model for each DUA (device under analysis) is retrieved from device models library 108. As discussed above, each device model contains a complete test routine for the particular device. This includes the details necessary to instruct test controller 104 how to test the DUA.

If, at step 316, a device model for a DUA is not present in device models library 108, then a device model is written for the DUA at step 318. Device models are manually written by the test programmer. Once the device model is written, it may be added to device models library 108.

After a device model has been retrieved for as many devices as possible, the test programmer analyzes the PCB to identify any devices which require clustering and then defines the clusters at step 320. A cluster model (i.e., test routine) is then written by the programmer and manually entered into the ATE system. Practically speaking, few (if any) clusters are actually defined this early in the test method due to the complexity of the circuits being tested and the difficulty in anticipating problems. More frequently, clusters are defined during execution of the in-circuit test (step 332) to remedy a problem incurred in testing a particular device.

At step 322, the test-specific electrical description for the PCB under test is produced. That is, the device models retrieved at step 314, the device models written at step 314, and any cluster models written at step 320 are used to customize the electrical description of the PCB for the particular test being generated. The test-specific electrical descriptions for two identical PCB's may differ depending on factors such as the clustering methodology and the type of test fixture used.

At step 324, the test-specific electrical description from step 322 for the PCB under test along with physical data from physical database 110 is used to generate test fixture description 326 and test source data 328. Test fixture description 326 represents the data required to generate the test fixture which interfaces the PCB under test with the ATE system. Test source data 328 includes the digital test patterns from the device and cluster models which have been adapted to the particular PCB under test. Adapting (or editing) involves removing conflicting test patterns and adding conditioning and disabling statements.

Finally, at step 330, test source data 328 and fixture description 326 are debugged, and modified for any problems not foreseen during test generation to produce a completed in-circuit test 332. It is at this debugging step that the majority of clustering normally occurs. Unfortunately, the test fixture is often built by this time such that modification might be necessary to accommodate testing of the clusters. Modifications to the test fixture are expensive and increase the time-to-production-release (i.e., production time loss), which is a critical profitability factor in manufacturing.

This conventional method has the additional weakness that cluster identification and definition must be performed by the test programmer who must analyze the circuit schematics based on his or her engineering judgment and experience. This method is time-consuming, prone to errors, and requires experience which is not readily available throughout the industry.

What is needed is a method which will automatically identify devices within an electronic circuit which may/must be tested together as a cluster and then retrieving, for each cluster, a pre-defined test pattern from a library.

SUMMARY OF THE INVENTION

The invention is a method for generating an in-circuit functional test for a loaded printed circuit board. The method automatically generates a test for groups or clusters of devices which are desired to be tested as a single functional unit. This is performed by pattern matching clusters of devices on the printed circuit board with pre-defined models from a cluster models library.

The method comprises the following steps. First, an electrical description of the printed circuit board is analyzed to identify any clusters of elements which match any of the cluster models. When a match is found, a generic test routine for the cluster is retrieved from the model. Tests for non-clustered devices are similarly generated. That is, each device is matched with a generic device model contained in a device models library. Each device model contains a test routine for the corresponding device.

At the heart of the invention is the method for matching a generic cluster model to a cluster of elements within the circuit under test. This step is performed as follows. First, a device is selected from the electrical description of the board for analysis. Next, a device model for the selected device is retrieved from the device models library. The device model contains a list of the arbitrarily defined functional elements of the selected device.

A single element of the selected device (e.g., a single gate on a multigate chip) is chosen for analysis. The selected element, along with its interconnected circuit elements, forms an element cluster which may be tested as a single unit. An index is checked to determine which cluster models include the selected element. The interconnection of each cluster model which contains the element is then compared to the element cluster. A matching cluster model will be a subset of the circuit under analysis. Once a matching model is found, then a generic test routine can be retrieved therefrom.

BRIEF DESCRIPTION OF THE DRAWINGS

In the figures, like reference numerals indicate like elements/steps.

DESCRIPTION OF THE PREFERRED EMBODIMENT

The present invention is a method for generating an in-circuit test for a PCB comprising a plurality of interconnected devices (e.g., digital and linear IC's). The invention, as described below and shown in the accompanying figures, provides a method for automatically matching a cluster of devices to a generic model which contains a pre-determined test routine. This allows the cluster to be tested and disabled as a single functional unit. The clusters models are stored in a library so that they can be re-used. This greatly speeds test generation by capturing the knowledge of a test programmer.

The following terms are defined for clarity and ease of reference. A "device" is an electrical component (e.g., a digital IC, a linear IC, a discrete semiconductor device, a resistor, an inductor, etcetera) on the PCB under analysis. An "element" is a pre-defined functionally distinct group of circuitry within a device. For example, a 74LS00 is a device which contains four NAND gates. Each NAND gate is an element. A discrete resistor is a single element device. This is explained in greater detail below. "Element cluster" refers to a group of interconnected elements which are sought to be functionally tested together as a unit. "Cluster model" refers to a digitally stored representation of an element cluster which contains the data required to generate a functional in-circuit test for an element cluster.

The method of the invention for generating an in-circuit test uses ATE system 100 as described above. The data required for test generation includes electrical database 112, device models library 108, and a cluster models library 308 (shown in FIG. 4).

Cluster models library 308 contains a plurality of pre-generated generic cluster models. Several different cluster models libraries may be constructed; each having a different objective. One library might be directed to solving common problems. For example, cluster 202 in circuit 200 of FIG. 2 is a common oscillator circuit which often creates problems during test and could be modeled and stored in a problems-type cluster models library. Another library might be constructed with the goal of reducing the number of test points required on a PCB. Yet another library might be used to promote higher throughout by testing large blocks of circuitry. The library may be selected by the test programmer prior to test based on his requirements.

Essentially, each cluster model is a test routine which is to be inserted directly into the PCB test specification such that the cluster may be tested as a single device. Thus, the contents of each cluster model is similar to that of each device model from device models library 108. That is, each cluster model will contain pin-out information (i.e., which pins are inputs, outputs, bi-directional, or unused), trace data (i.e., information which relates each cluster output to the cluster inputs which affect it), a test routine, a method for pre-conditioning each output of the cluster, and cluster specific information including a test pattern rate and required signal levels. In addition, each cluster model will contain information which allows pattern matching (i.e., cluster identification). The cluster model and pattern matching are discussed in greater detail below.

Figure 4:
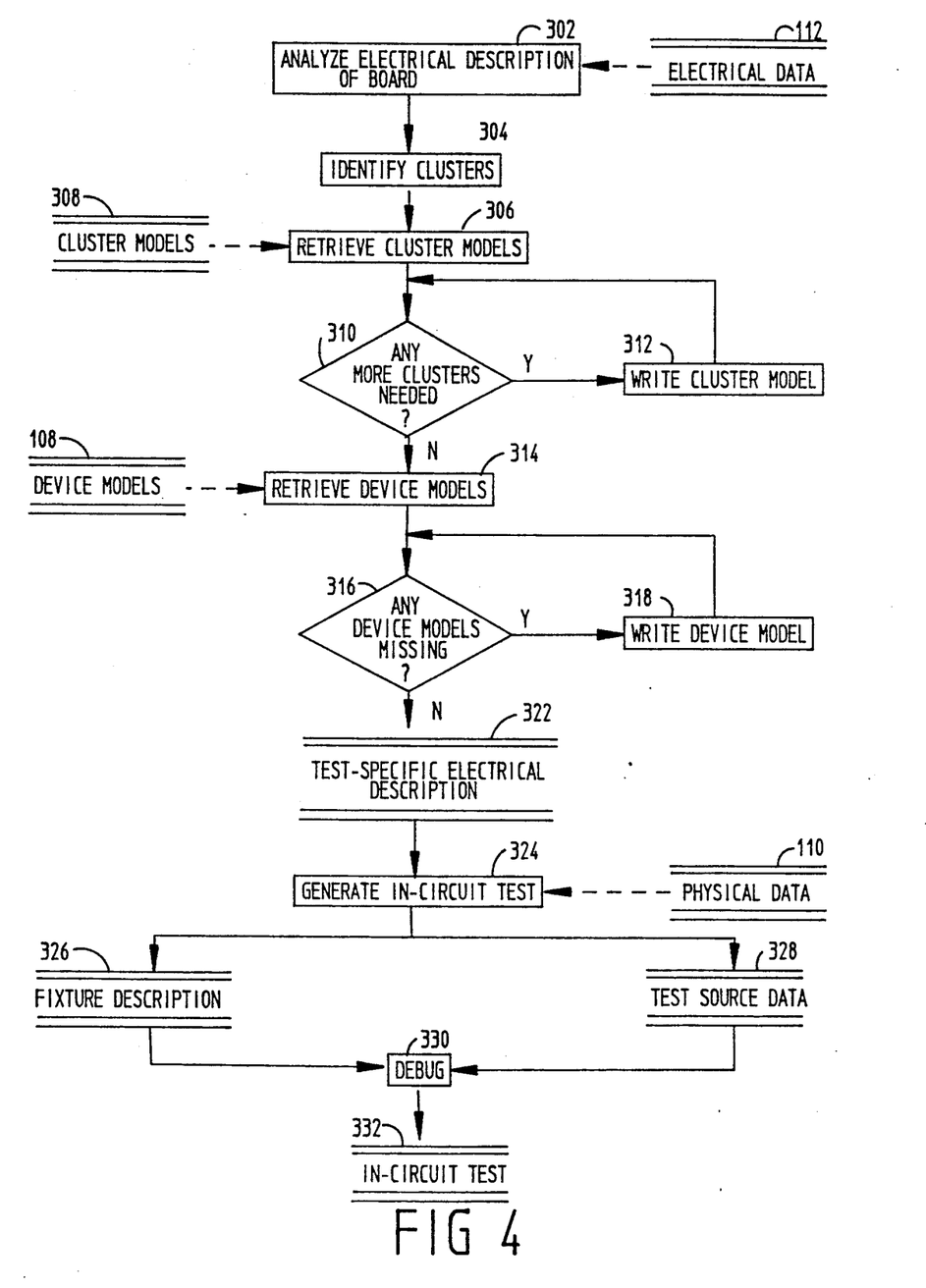
FIG. 4 is a flow chart illustrating the steps of the invention for generating an in-circuit test for a loaded PCB.

The preferred embodiment of the present invention is now described with reference to FIG. 4. At step 302, an electrical description of the PCB from electrical database 112 is analyzed to determine which devices require testing. Next, at step 304, the PCB under test is analyzed to identify interconnected devices or element clusters which match a cluster model. This is accomplished by comparing (pattern matching) the circuit topology to the pre-defined cluster models in cluster models library 308. The mechanism for performing this comparison is described in detail below with reference to FIG. 5. When a match is found, a test routine for the element cluster is retrieved from the matching cluster model at step 306.

At step 310, the test programmer is given the opportunity to add cluster models, if desired. If additional cluster models are desired, then they are written by the test programmer at step 312. Any new models written at step 312 may be added to cluster models library 308 for re-use.

After all element clusters have been identified and tests patterns have been generated (retrieved), the devices on the PCB will fit into one of three categories. These include devices which have: (1) no elements included in an element cluster, (2) at least one element included in an element cluster and at least one element not included in an element cluster, and (3) all elements included in an element cluster. Type (1) devices will not be affected by cluster test generation. Therefore, these devices must have a test pattern generated on a device level as described below. Type (2) devices will be partially affected by cluster test generation. Only the non-clustered elements of these devices still need to have a test pattern generated for them. A test for only these elements can be generated by performing test generation at the device level (described below) with the clustered I/O pins marked so that test generation is not duplicated for them. The preferred method, however, is to generate a full device test for the type (2) device such that the clustered elements are tested twice. Type (3) devices will be completely tested via cluster test such that further tests need not be generated. Type (3) devices can be skipped during device level test generation.

Device level test generation proceeds substantially identically to that set forth in FIG. 3. That is, a generic device model is retrieved from device models library 108, at step 314, for each DUA which is not included in an element cluster. If, at step 316, a device model for a DUA is not present in device models library 108, then a device model is written for the DUA at step 318. Device models are manually written by the test programmer. Once the device model is written, it may be added to device models library 108.

At step 322, the test-specific electrical description for the PCB under test is produced. That is, the cluster models retrieved at step 306 and written at step 312 and the device models retrieved at step 314 and written at step 318 are used to customize the electrical description of the PCB for the particular test being generated. The test-specific electrical descriptions for two identical PCB's may differ depending on factors such as the clustering methodology and the type of test fixture used.

At step 324, the test-specific electrical description from step 322 along with physical data from physical database 110 is used to generate test fixture description 326 and test source data 328. Test fixture description 326 is the data which is required to generate the test fixture which interfaces the PCB under test with the ATE system. Test source data 328 includes the digital test patterns from the device and cluster model which have been edited for the particular PCB under test. Editing involves removing patterns which have conflicts and adding conditioning and disabling statements.

Finally, at step 330, test source data 328 and fixture description 326 are debugged, and modified for any problems not foreseen during test generation, to produce the final in-circuit test 332.

The step of identifying clusters within a circuit under test (step 304 above) is now described in greater detail with reference to FIG. 5. At step 3041, a device or DUA is selected from electrical data 112 for possible clustering. At step 3042, the device model for the DUA is retrieved from device models library 3043. Device models library 3043 is not the same as device models library 108. However, library 108 may be modified to include the additional information from device model library 3043.

Device models library 3043 contains device structural models which include the functional elements and pin-out information for each device. For example, a 74LS00 is a quad, NAND gate IC. The model for the 74LS00 may be represented as follows (note that "!" indicates a comment in the source code and that "DC" means "don't care"):

```
! 74LS00
    pin 7 DC
    pin 14 DC
    element "NAND"
        pin 1 "input"
        pin 2 "input"
        pin 3 "output"
    end
    element "NAND"
        pin 4 "input"
        pin 5 "input"
        pin 6 "output"
    end
    element "NAND"
        pin 8 "input"
        pin 9 "input"
        pin 10 "output"
    end
    element "NAND"
        pin 11 "input"
        pin 12 "input"
        pin 13 "output"
    end
! end of model
```

Similarly, the following are examples of models for an oscillator and a resistor, respectively:

```
! Oscillator
    pin 7 DC
    pin 14 DC
    element "osc-16MHz"
        pin 8 "output"
    end
! end of model
! Resistor
    element "r2K"
        pin 1 "pin"
        pin 2 "pin"
    end
! end of model
```

Note that each element is given a name in library 3043.

In addition to the device models, device models library 3043 may also contain alias elements. An "alias element" is a group or set of previously defined, related elements which is used to represent a single element in a cluster model. That is, an alias element provides a general specification of which element types will match an element in a cluster model. The following are examples of alias elements:

```
!alias element "R"
    R: r2K, r2.2K, r10K, r47K
!alias element "R>5K"
    R>5K: r10K, r47K
!alias element "oscillator"
    oscillator: osc-6MHZ, osc-12MHz, osc-16MHz
```

Use of an alias element in a model is illustrated in the following example. The alias element "R>5K" allows any resistor having a value greater than 5K Ω to be represented in a cluster model. If a cluster model specifies an element "R>5K" and a cluster of elements contains an element labeled r47K, then a cluster match can occur since r47K is a member of the alias set for "R>5K".

At this point, it should be understood that an "element" may be defined to represent any combination of components desired and may be given an arbitrary name, so long as the definitions are consistent between the cluster models in cluster models library 308 and the device models in device models library 3043. The "resources" of each device may also be arbitrarily named, subject to the same requirement of consistency. A "resource" is an input or output connection of an element. For example, the cluster model presented above for a resistor includes an element arbitrarily named "r2K" which has two resources which are each arbitrarily named "pin".

This arbitrary naming of elements and resources is possible because cluster matching is done on a purely symbolic (i.e., non-functional) basis. It is not necessary to know the function of an element (or a resource) because the method of the invention treats each element like a "black box" entity having labeled resources.

At step 3044, a single element, within the model for the selected device, is chosen for cluster analysis. This selected element is called the "element under analysis" or EUA. At step 3045, a cluster models index 3046 is checked to determine which cluster models contain the EUA. Cluster models index 3046 is a cross-reference of elements to the cluster models which use them. A potentially matching cluster models list 3047 results from step 3045. Next, at step 3048, it is determined which elements in the circuit under test are connected to the EUA using electrical data 112. From this step, a connected elements and I/O pin usage list 3049 is produced for the EUA.

Connected elements list 3049 is then used in step 3050 to refine potentially matching cluster models list 3047. That is, the interconnection of the EUA in the circuit under test is compared with the interconnection of the EUA in each potentially matching cluster model. This is only done for devices connected immediately to the EUA. A reduced set of potentially matching clusters 3051 results from this step 3050.

Finally, at step 3052, a matching cluster model is located using an element by element comparison (of the EUA and its connected elements) to each of the cluster models in reduced set of potentially matching clusters 3051. The element by element comparison involves selecting a cluster model under analysis (CMUA) from reduced set of potentially matching clusters 3051. The connection of each node (both internal and external) of the CMUA is then compared with the connection of each corresponding node of the circuit under test by starting at the EUA and exploring the circuitry in all directions. In effect, this is equivalent to selecting a new EUA from the elements of the CMUA (rather than from the circuit under test) and then comparing its interconnection with that of the circuit under test. This is done for every element of the CMUA.

If a match is found, then a matching cluster model 3053 is identified. Cluster model 3053 can then be retrieved from cluster models library 308 (step 306 of FIG. 4). The element cluster (i.e., EUA and its connected elements which match the cluster model) may then be tested as a functional unit according to the test routine contained in the cluster model.

Figure 6:
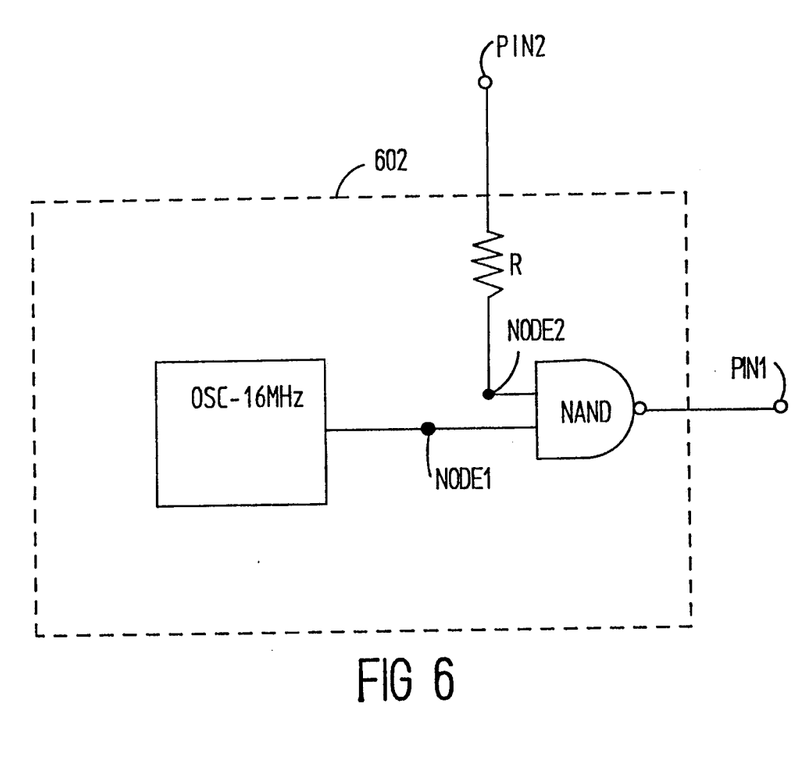
FIG. 6 is a schematic diagram of a cluster model which could be substituted for cluster 202 of FIG. 2.

As discussed above, cluster models library 308 contains a plurality of pre-generated generic models for commonly used element clusters. FIG. 6 shows a sample cluster model 602 which may be used to model element cluster 202 shown in FIG. 2. The portion of cluster model 602 used for pattern matching may be represented as follows:

---

! oscillator cluster
    external pin 1: NAND."output"
    external pin 2: R."pin"
    internal node 1: osc-16MHz."output", NAND."input"
    internal node 2: NAND."input", R."pin"

---

Figure 5:
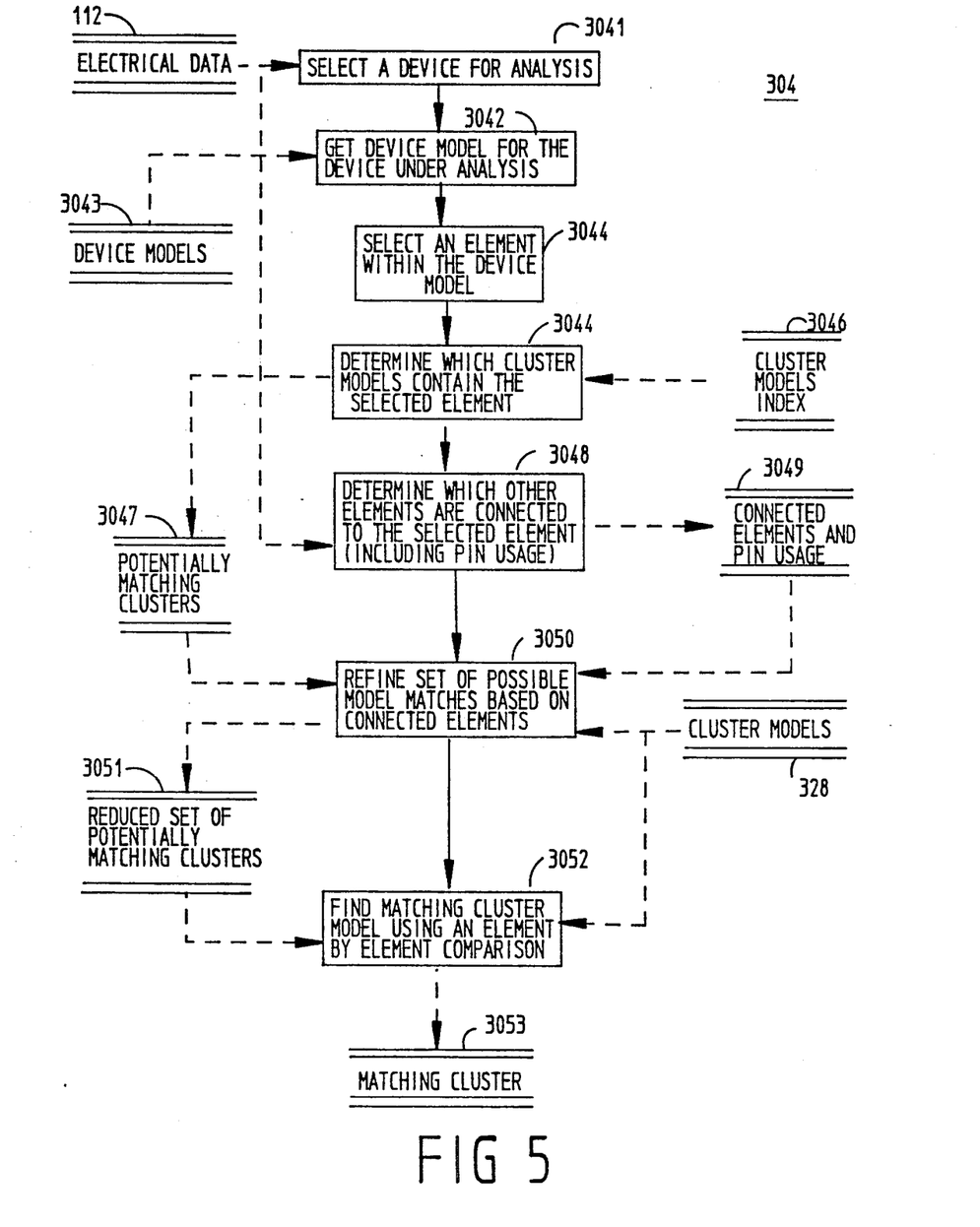
FIG. 5 is a detailed flow chart illustrating the preferred embodiment of step 304 of FIG. 4.
Figures 7A, 7B:
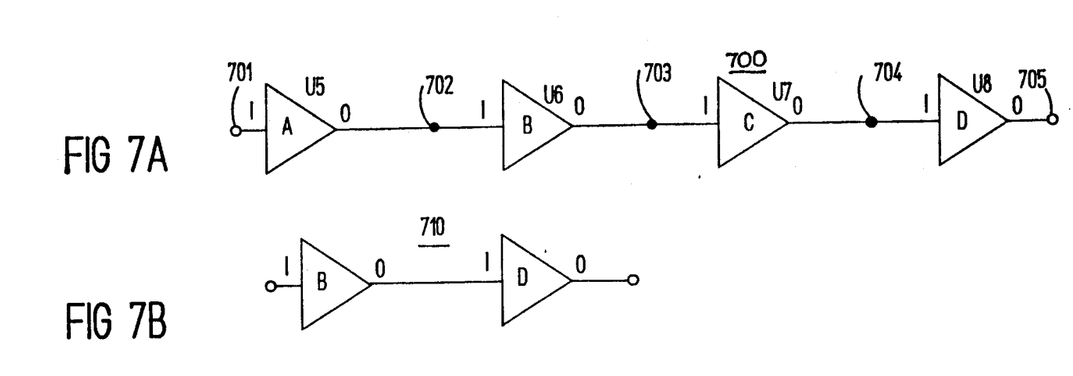
FIG. 7(a) is a simple schematic diagram of a sample circuit 700 used to illustrate cluster pattern matching.
FIGS. 7(b)-7(e) are schematic diagrams of cluster models used to illustrate cluster pattern matching for the sample circuit 700.
Figures 7C, 7D:
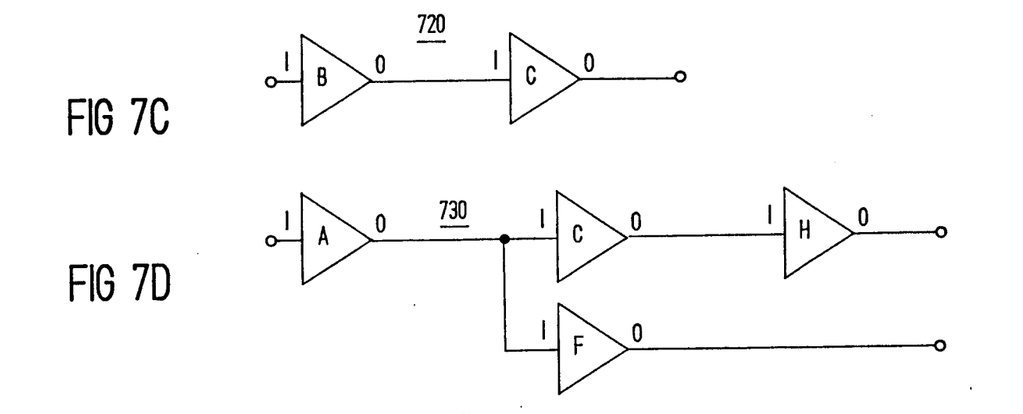
Figure 7E:
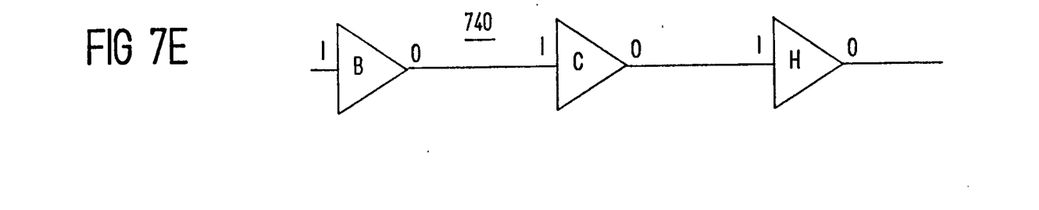

Referring now to FIGS. 5, 7 and 8, an example of matching (step 304) an element cluster to a cluster model is provided. Circuit 700, shown in FIG. 7(a), is a simple circuit which includes four gates connected in series. Gate U5 is connected between nodes 701 and 702. Gate U6 is connected between nodes 702 and 703. Gate U7 is connected between nodes 703 and 704. Gate U8 is connected between nodes 704 and 705. U5 is an element of type "A". U6 is an element of type "B". U7 is an element of type "C". U8 is an element of type "D". "I" is used to designate an input. "O" is used to designate an output.

Select gate U6 as the EUA (step 3044). U6 may then be identified as a type "B" element (step 3044). Four sample cluster models 710, 720, 730, and 740 are shown in FIGS. 7(b)–7(e). A search of cluster models index 3046 reveals (step 3045) that a type "B" element is used in cluster models 710, 720, and 740. Cluster model 730 does not contain a "B" type element and therefore is not selected for further consideration.

Figure 8A:
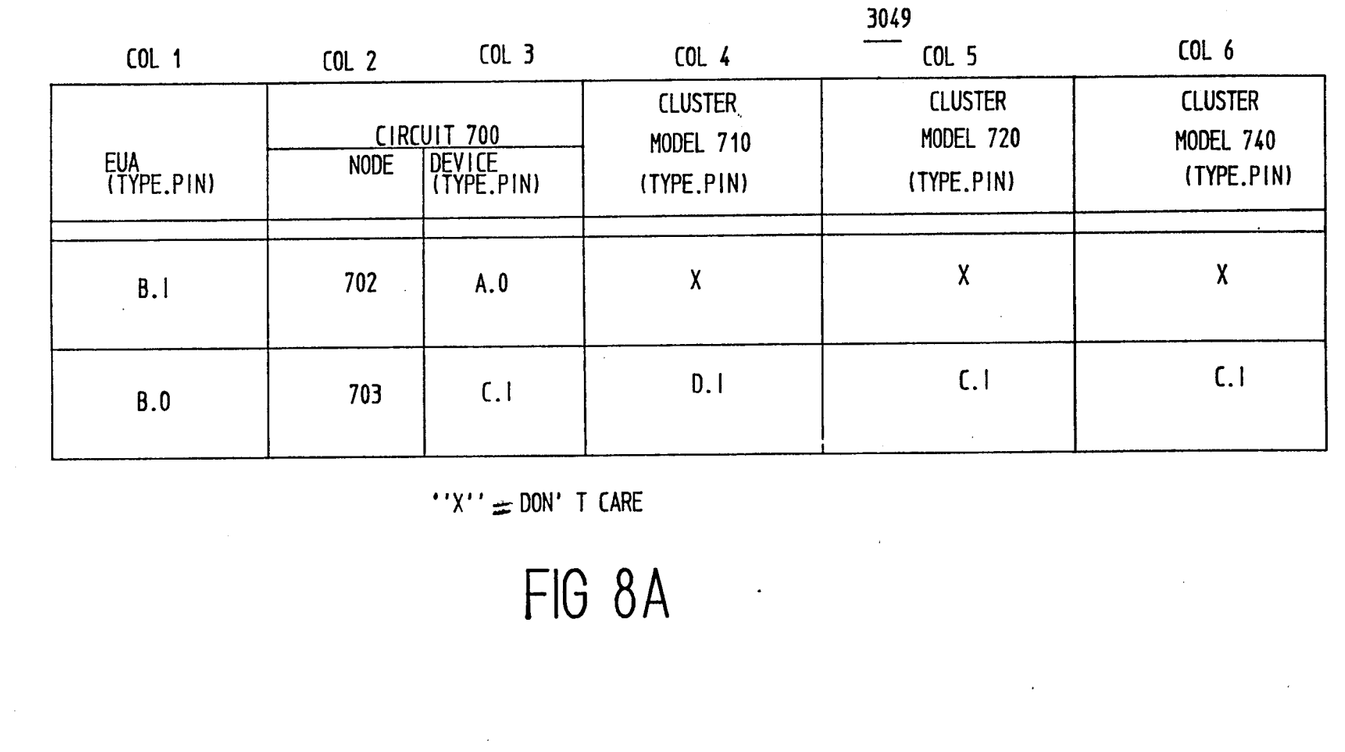
FIGS. 8(a) and 8(b) show tables which are used to illustrate cluster pattern matching for the example set forth in FIG. 7.

Next, the list of potentially matching clusters is refined by comparing the immediate interconnection of the EUA in circuit 700 to the interconnection of the EUA in each of cluster models 710, 720 and 740. To accomplish this, a connection table 3049 is constructed (step 3048) for the EUA. Table 3049 is shown in FIG. 8(a). In the table, each I/O pin of the EUA is analyzed for connection to other elements. This is done in columns 2 and 3 for circuit 700; in column 4 for cluster model 710; in column 5 for cluster model 720; and in column 6 for cluster model 740. The EUA type and pin under analysis are listed in column 1. For example, in the first row of table 3049, the input pin "I" of element "B" (represented as "B.I") is listed as being connected to the output (pin "O") of element "A" (represented as "A.O") in circuit 700.

Figure 8B:
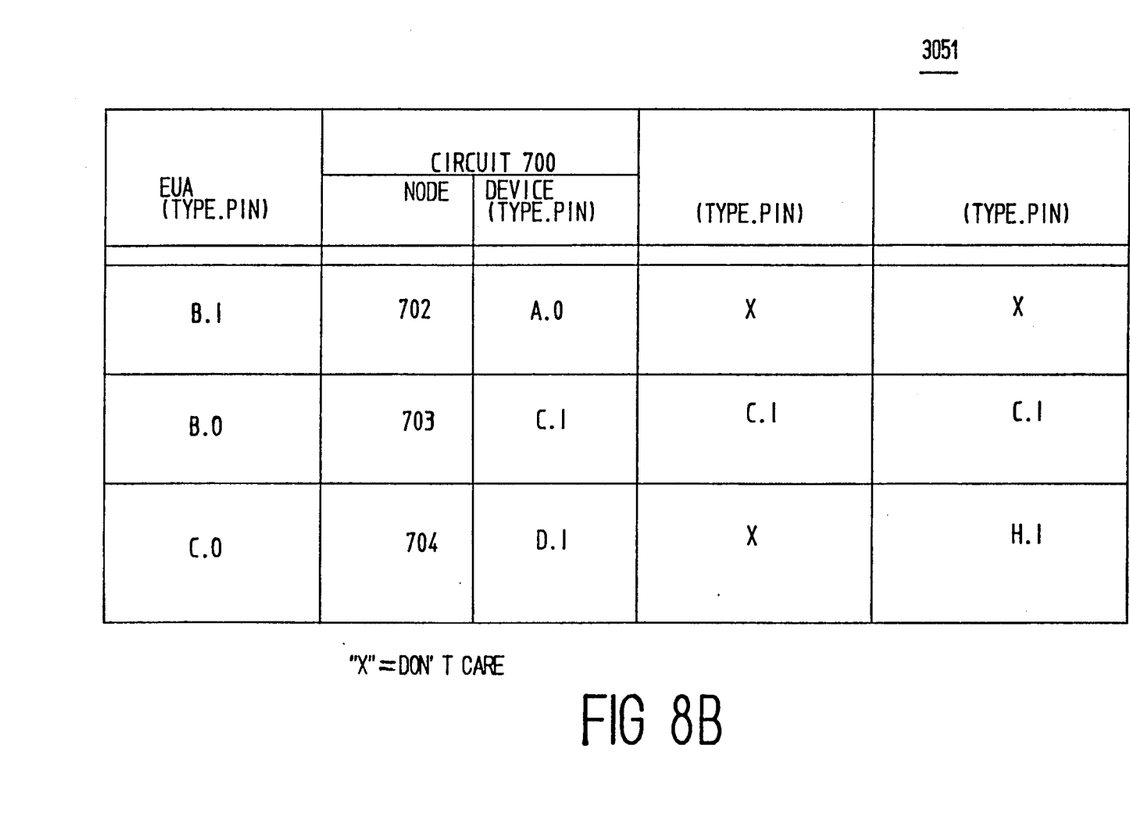

As can be seen from inspection of FIG. 8(a), only cluster models 720 and 740 are connected similarly to U6 of circuit 700. Thus, cluster model 710 can be removed from the list of potentially matching cluster models (3047) at this point (step 3050). The remaining cluster models 720 and 740 are then closely compared to circuit 700 in a second connection table 3051 using an element by element comparison (step 3052). Table 3051 is shown in FIG. 8(b).

As can be seen in table 3051, each element (and thus each node) of cluster models 720 and 740 is compared to circuit 700. Model 720 contains two elements: "B" and "C". Since "B" has already been analyzed at step 3050, element "C" is selected as the next EUA. The interconnection of element "C" matches that of circuit 700 and element "C" is connected to an external node. Therefore, model 720 is a matching cluster model and may be used to emulate element cluster U6,U7 during test.

Model 740 contains three elements: "B", "C", and "H". Again, the interconnection of element "B" was previously analyzed at step 3050. Therefore, element "C" is selected as the EUA. The output of element "C" is connected to an element "H" in the model while element "C" is connected to an element D in circuit 700. Thus, cluster model 730 does not match circuit 700. This is illustrated in table 3051.

Note that three nodes are listed in table 3051: node B.I, node B.O, and node C.O. Only node C.O is required in this table. Nodes B.I and B.O were previously analyzed with element "B" in step 3050 (table 3049) discussed above. Analyses for nodes B.O and B.I are repeated in table 3051 for illustration purposes only.

The inventors anticipate that the invention will be optimized by using a large number of relatively simple cluster models rather than a few more complex cluster models. The simple cluster models will have a wider range of applications. Further, the simple cluster models can be combined to form more complex models. This is illustrated by continuing the example of FIG. 7.

Figure 9A:
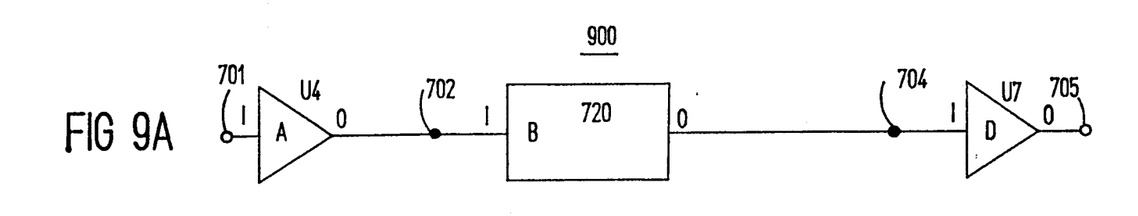
FIG. 9(a) is a schematic diagram of a test model 900 which results from the substitution of cluster 720 into the circuit 700.
Figure 9B:
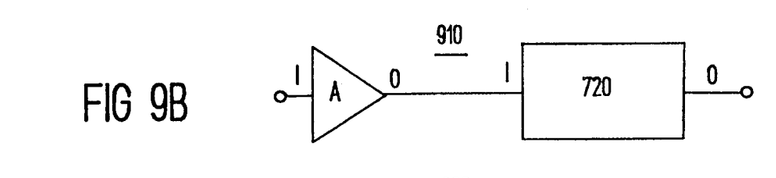
FIG. 9(b) is a schematic diagram of a sample cluster model 910 which is used to illustrate cluster pattern matching for the test model 900.
Figure 9C:
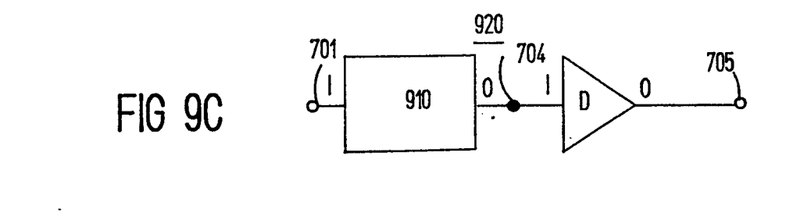
FIG. 9(c) is a schematic diagram of a test model 920 which results from the substitution of cluster 910 into the test model 900.

A test model 900 is shown in FIG. 9(a). Model 900 results from substituting cluster model 720 for elements U6 and U7 of circuit 700. If desired, further clustering may be performed on test model 900 by repeating the steps outlined above. For example, a cluster model 910 is shown in FIG. 9(b). Cluster model 910, which contains element A and cluster 720, may be substituted for U5 and cluster 720 of test model 900 to produce the test model shown in FIG. 9(c).

There is no limit to the number of clustering passes which a test programmer may make through a circuit. The programmer may cluster as much or as little as he or she desires in view of the test requirements.

As discussed above, cluster matching is a symbolic process in which the function of each element is not considered. In an alternate embodiment, some cluster models may have transfer functions assigned to them. This will allow higher-order cluster models to combine (via convolution) transfer functions to produce an overall cluster transfer function. This is especially useful for analog circuits. Certain parameters (e.g., resistor values) could be input by the test programmer after the circuit has been modeled.

While the invention has been particularly shown and described with reference to a preferred embodiment thereof, it will be understood by those skilled in the art that various changes in form and details may be made therein without departing from the spirit and scope of the invention.

I claim:

1. In an automated test equipment system for testing a printed circuit board containing a plurality of interconnected devices wherein each device includes at least one element, a method performed by a test generator of the automated test equipment system for generating a functional test, the method comprising the following steps:

(a) analyzing electrical data descriptive of the circuit board to identify an element cluster which matches a pre-defined cluster model in a cluster models library, said element cluster including a plurality of interconnected elements, said pre-defined cluster model including a test routine for said element cluster, having the steps of:

(1) selecting one of said plurality of interconnected devices for analysis, (2) retrieving a device model for said selected device from a device models library, said device model including a functional description of said selected device, (3) selecting, based on said functional description, a single element of said selected device for analysis, said single element being interconnected with at least one other element to form said element cluster, (4) determining which pre-defined cluster models in a cluster models library includes said single element, and (5) comparing the interconnection of said single element on the printed circuit board with an interconnection of said single element in each said pre-defined cluster model to determine if any of said pre-defined cluster models match said element cluster;

(b) retrieving said test routine from said pre-defined cluster model; and (c) automatically generating a functional test for said element cluster based on said test routine.

2. In an automated test equipment system for testing a printed circuit board containing a plurality of interconnected devices wherein each device includes at least one element, a method performed by a test generator of the automated test equipment system for generating a functional test, the method comprising the following steps:

(a) analyzing electrical data descriptive of the circuit board to identify an element cluster which matches a pre-defined cluster model in a cluster models library, said element cluster including a plurality of interconnected elements, said predefined cluster model including a test routine for said element cluster;

(b) retrieving said test routine from said pre-defined cluster model;

(c) automatically generating a functional test for said element cluster based on said test routine;

(d) repeating steps (a) through (c) as required;

(e) determining which devices still require test generation following steps (a) through (d);

(f) for each said device still requiring test generation, retrieving a pre-defined device model from a device models library, each said pre-defined device model including a test routine for a corresponding device; and (g) automatically generating a functional test for each said device still requiring test generation based on said test routine contained in said pre-defined device model.

* * * * *